United States Patent
Kim et al.

(10) Patent No.: US 6,457,141 B1
(45) Date of Patent: Sep. 24, 2002

(54) SEMICONDUCTOR DEVICE WITH EMBEDDED MEMORY CELLS

(75) Inventors: Won-Chul Kim, Youngin; Boo-Yung Huh, Suwon, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/413,893

(22) Filed: Oct. 7, 1999

(30) Foreign Application Priority Data

Oct. 8, 1998 (KR) .............................. 98-42079

(51) Int. Cl.⁷ ................................ H02H 3/05
(52) U.S. Cl. .................. 714/30; 714/733; 714/734
(58) Field of Search .............. 714/30, 29, 31, 714/32, 718, 719, 724, 725, 726, 733, 734

(56) References Cited

U.S. PATENT DOCUMENTS

| | | | |
|---|---|---|---|
| 5,600,658 A | * 2/1997 | Qureshi | 708/530 |
| 5,878,051 A | * 3/1999 | Sharma et al. | 714/724 |
| 5,995,731 A | * 11/1999 | Crouch et al. | 395/500.05 |
| 6,088,823 A | * 7/2000 | Ayres et al. | 714/733 |
| 6,263,461 B1 | * 7/2001 | Ayres et al. | 714/718 |

* cited by examiner

*Primary Examiner*—Dieu-Minh Le
(74) *Attorney, Agent, or Firm*—Lee & Sterba, P.C.

(57) ABSTRACT

A semiconductor device with embedded memory cells is provided, wherein the device comprises a memory block, a logic block for inputting and outputting data with the memory block and performing specific functions, and an embedded test circuit block for testing the memory block with the signals input from outside the device. The device comprises a plurality of signal terminal groups for sending and receiving signals to and from outside the device to perform a normal operation, a direct access test and a built-in self test.

8 Claims, 2 Drawing Sheets

SEMICONDUCTOR DEVICE WITH EMBEDDED MEMORY CELLS

BACKGROUND OF THE INVENTION

1. Field of the Invention

The present invention relates to a semiconductor device with embedded memory cells, and more particularly to a semiconductor device with embedded memory cells which can perform tests, a direct access test with a memory tester and a built-in self test with an embedded test circuit, without changes in probing between the semiconductor device and a memory tester.

2. Description of the Related Art

The semiconductor device with embedded memory cells comprises a logic block, a memory block and an embedded test circuit block. In the semiconductor device, the memory tester tests the memory block in the direct access test mode. On the other hand, the logic tester tests the logic block and the embedded test circuit block tests the memory-block in the built-in self test mode, i.e., BIST.

Thus, a conventional semiconductor device with embedded memory cells comprises separate pins: the pins (or pads) used for performing a direct access test on the memory block with a memory tester; and the pins (or pads) used for performing a built-in self test on the logic block and the memory block with a logic tester.

In other words, the direct access test and the built-in self test are used together to test the memory block of the semiconductor device with embedded memory cells.

In order to analyze a defect of the memory block detected in the built-in self test with a logic tester it is necessary to simultaneously perform the direct access test and the built-in self test with a memory tester.

However, there is a problem in the conventional semiconductor device with embedded memory cells in that it is necessary to modify the connection of pins between the memory tester and the semiconductor device when performing the respective tests, because the pins are separately installed for the direct access test mode and the built-in self test mode.

FIG. 1 is a block diagram for illustrating the conventional semiconductor device with embedded memory cells. The semiconductor device 100 comprises a logic block 10, a memory block 20, an embedded test circuit block 30, multiplexers 40, 42, 44, 46, 48 and pads 50, 52, 54, 56, 58, 60, 62.

The functions of respective blocks will be described below. The logic block 10 inputs and outputs data between the memory block 20, thereby performing specific functions that are designed by a designer. The memory block 20 writes and reads data in response to addresses or control signals. The embedded test circuit block 30 responds to BIST control signals sent from outside the device and generates internal addresses, control signals and data signals to write and read data to the memory block 20. The embedded test circuit block 30 also determines whether the read data is identical to the written data and sends the test results about the functional states of the memory block 20 out of the semiconductor device. The pad 50 is used only in the normal operation mode, but not in the test modes. The pad 52 is a control pad to transmit control signals for changing modes between normal operation, the direct access test and the built-in self test. The pad 54 inputs and outputs data with the logic block 10 in the normal operation mode, and transmits addresses to the memory block 20 in the direct access test mode. The pad 56 inputs and outputs data with the logic block 10 in the normal operation mode, and transmits control signals to the memory block 20 in the direct access test mode. The pad 58 inputs and outputs data with the logic block 10 in the normal operation mode, and inputs and outputs data with the memory block 20 in the direct access test mode. The pad 60 inputs and outputs data with the logic block 10 in the normal operation mode, and transmits BIST control signals to the embedded test circuit block 30 in the BIST mode. The pad 62 inputs and outputs data with the logic block 10 o operation mode, and outputs the test result generated from the embedded test circuit block 30 in the BIST mode.

The multiplexer 40 responds to mode control signals to input and output data between the pad 54 and the logic block 10 in the normal operation mode, and to transmit addresses from the pad 54 to the memory block 20 in the direct access test mode. The multiplexer 42 responds to the mode control signals to input and output data between the pad 56 and the logic block 10 in the normal operation mode, and to transmit control signals from the pad 56 to the memory block 20 in the direct access test mode. The multiplexer 44 responds to mode control signals to input and output data between the pad 58 and the logic block 10 in the normal operation mode, and to input and output data between the pad 58 and the memory block 20 in the direct access test mode. The multiplexer 46 responds to mode control signals to input and output data between the pad 60 and the logic block 10 in the normal operation mode, and to transmit BIST control signals from the pad 60 to the embedded test circuit block 30 in the direct access test mode. The multiplexer 48 responds to mode control signals to input and output data between the pad 62 and the logic block 10 in the normal operation mode, and to output the test result generated from the embedded circuit block 30 to the pad 62 in the direct access test mode. The multiplexers 40, 42, 44, 46, 48 are respectively constructed in the structure of a general 2-1 multiplexer.

Reference signs shown in FIG. 1 will be described below. S symbolizes a respective signal in the drawings. S1 is an input and output signal between the pad 50 and the logic block 10. S2 is a mode control signal. S3 is a data input and output signal of the logic block 10. Signals (S8$a, b, c, d, e$) are those derived from the S3. Signals (S4$a, b, c$) are input and output signals between the pads 54, 56, 58 and the logic block 10 in the normal operation mode. S4$a$ and S4$b$ are addresses and control signals transmitted from the pads 54, 56 to the memory block 20, and S4$c$ is a test result input and output signal between the pad 58 and the memory block 20. S5$a$ is a BIST control signal transmitted from the pad 60 to the embedded test circuit block 30, and S5$b$ is a test result signal transmitted from the embedded test circuit block 30 to the pad 62. In the built-in self test mode S7$a$ and S7$b$ are respectively related to S5$a$ and S5$b$. S9 is a signal transmitted between the logic block 10 and the memory block 20, and S10 is a signal transmitted between the memory block 20 and the embedded test circuit block 30. In the drawings these signals do not have one identical bit, but respectively a predetermined bit. Even if each of the pads 50, 52, 54, 56, 58, 60 is respectively shown as one pad, it is not composed of a single pad but grouped by combining the predetermined number of pads with similar functions. The other pads without specific numerals belong to one of those represented in specific reference numerals.

First, the direct access test of the conventional semiconductor device with embedded memory cells will be described with reference to FIG. 1. In the case of the direct access test, a mode control signal is transmitted from the memory tester (not shown) through the pad 52 to the multiplexers 40, 42, 44, 46, 48. The multiplexers 40, 42, 44 output addresses, control signals and data signals to the memory block 20. In the direct access test mode, signals are not input to the pads 50, 60, 62. Therefore, the memory tester writes data through the pad 58 to the memory block 20 and reads the written data to determine whether they are identical to the written data for testing the operational states (normal or defective) of the memory block 20. This direct access test is performed in accordance with the test procedures programmed in the memory tester.

The procedures of the direct access test are briefly described as follows: (1) write data when a write command, addresses and test data are transmitted; (2) read the written data when a read command, addresses and test data are transmitted; and (3) determine whether the read data are identical to the written data for testing the operational state of the memory block 20. This test is performed by repeating the aforementioned procedures of writing and reading data to corresponding addresses, which are increased or decreased.

Next, the built-in self test of the conventional semiconductor device with embedded memory cells will be described with reference to FIG. 1. In the case of the built-in self test, a BIST control signal is sent from the memory tester (not shown) through the pad 52 to the multiplexer 46. In the built-in self test mode, signals are not input to the pads 50, 54, 56, 58, 62. When the BIST control signal is transmitted from the pad 60 through the multiplexer 46 to the embedded test circuit block 30, the built-in self test is performed by transmitting addresses, control signals and data signals from the embedded test circuit block 30 to the memory block 20. The embedded test circuit block 30 increases and decreases addresses, repeats the procedures of writing and reading data to transmit a test result through the multiplexer 48 to the pad 62. The test result is obtained in the embedded test circuit block 30 by determining whether the written data are identical to the read data.

As described above, there is a problem in the conventional semiconductor device with embedded memory cells in that a longer period of time is required for probing respective test modes, especially in switching the test modes because the pads (or pins) are separately installed for respective test modes, the direct access test and the built-in self test.

SUMMARY OF THE INVENTION

The present invention is provided to solve the aforementioned problems, and it is a feature of the present invention to provide a semiconductor device with embedded memory cells, the device having a memory tester to perform tests without probing respective test modes especially in switching the test modes between the direct access test and the built-in self test.

In accordance with one feature of the present invention, there is provided a semiconductor device with embedded memory cells, wherein the device comprises a memory block, a logic block for inputting and outputting data with the memory block and performing specific functions and an embedded test circuit block for testing the memory block inside thereof in accordance with the signals input from outside the device. The device comprises: a first signal terminal group for inputting mode control signals from outside to perform normal operation, direct access test and built-in self test; a second signal terminal group for inputting and outputting the data sent from outside to the logic block; a third signal terminal group for transmitting addresses from outside to the memory block in the direct access test mode and for inputting and outputting data with the logic block in the normal operation mode; a fourth signal terminal group for transmitting the mode control signals to the memory block in the direct access test mode, for inputting and outputting data with the logic block in the normal operation mode and for transmitting mode control signals to the embedded circuit block in the built-in self test mode; a fifth signal terminal group for inputting and outputting the test result with the memory block in the direct access test mode, for inputting and outputting data with the logic block in the normal operation mode and for outputting the test result generated from the embedded test circuit block to outside; first selection apparatus for transmitting data between the third signal terminal group and the logic block in the normal operation mode in response to mode control signals and for transmitting addresses from the third signal terminal group to the memory block in the direct access test mode; second selection apparatus for transmitting data between the fourth signal terminal group and the logic block in the normal operation mode in response to mode control signals and for transmitting control signals from the fourth signal terminal group to the memory block in the direct access test mode and for transmitting control signals from the fourth signal terminal group to the embedded test circuit block in the built-in self test mode; and third selection apparatus for transmitting data between the fifth signal terminal group and the logic block in the normal operation mode in response to the mode control signals and for inputting and outputting data between the fifth signal terminal groups and memory block in the direct access test mode and for outputting the test result from the embedded test circuit block through the fifth signal terminal group in the built-in self test mode.

In accordance with another feature of the invention, there is provided a semiconductor device with embedded memory cells having at least three modes, a normal operation, a direct access test and a built-in self test. The device comprises: a logic block for inputting and outputting data from a memory block; a memory block for writing and reading data in response to addresses or control signals; an embedded test circuit block for performing read/write tests on the memory block; at least three multiplexers; a control pad to transmit mode control signals to at least one multiplexer for changing modes between the normal operation, direct access test and built-in self test; a first pad for inputting and outputting data with the logic block in the normal operation mode, and transmitting addresses to the memory block in the direct access test mode; a second pad for inputting and outputting data with the logic block in the normal operation mode, transmitting control signals to the memory block in the direct access test mode, and transmitting BIST control signals to the embedded test circuit block in the built-in self test mode; a third pad for inputting and outputting data with the logic block in the normal operation mode, inputting and outputting data with the memory block in the direct access test mode, and outputting a test result generated from the embedded test circuit block in the built-in self test mode.

In accordance with another feature of the invention, there is provided a semiconductor device with embedded memory cells having three modes of operation: a normal operation, a direct access test and a built-in self test. The device comprises: a logic block; a memory block; an embedded test circuit block; first means for transmitting control signals for changing modes between the normal operation, direct access test and built-in self test; second means for inputting and outputting data with the logic block in the normal operation mode, and transmitting addresses to the memory block in the direct access test mode; third means for inputting and outputting data with the logic block in the normal operation mode, transmitting control signals to the memory block in the direct access test mode, and transmitting BIST control signals to the embedded test circuit block in the built-in self test mode; fourth means for inputting and outputting data with the logic block in the normal operation mode, inputting and outputting data with the memory block in the direct access test mode, and outputting a test result generated from the embedded test circuit block in the built-in self test mode; fifth means for responding to mode control signals and to input and output data between the second means and the logic block in the normal operation mode, and to transmit addresses from the second means to the memory block in the direct access test mode; sixth means for responding to the mode control signals and to input and output data between the third means and the logic block in the normal operation mode, to transmit control signals from the third means to the memory block in the direct access test mode, and to transmit BIST control signals from the third means to the embedded test circuit block in the built-in self test mode; and seventh means for responding to the mode control signals and to input and output data between the fourth means and the logic block in the normal operation mode, to input and output data between the fourth means and the memory block in the direct access test mode, and to output a test result generated from the embedded test circuit block to the fourth means in the built-in self test mode.

DETAILED DESCRIPTION OF THE INVENTION

Korean patent application no. 98-42079, filed on Oct. 8, 1998, is hereby incorporated by reference as if fully set forth herein.

Figure 2:
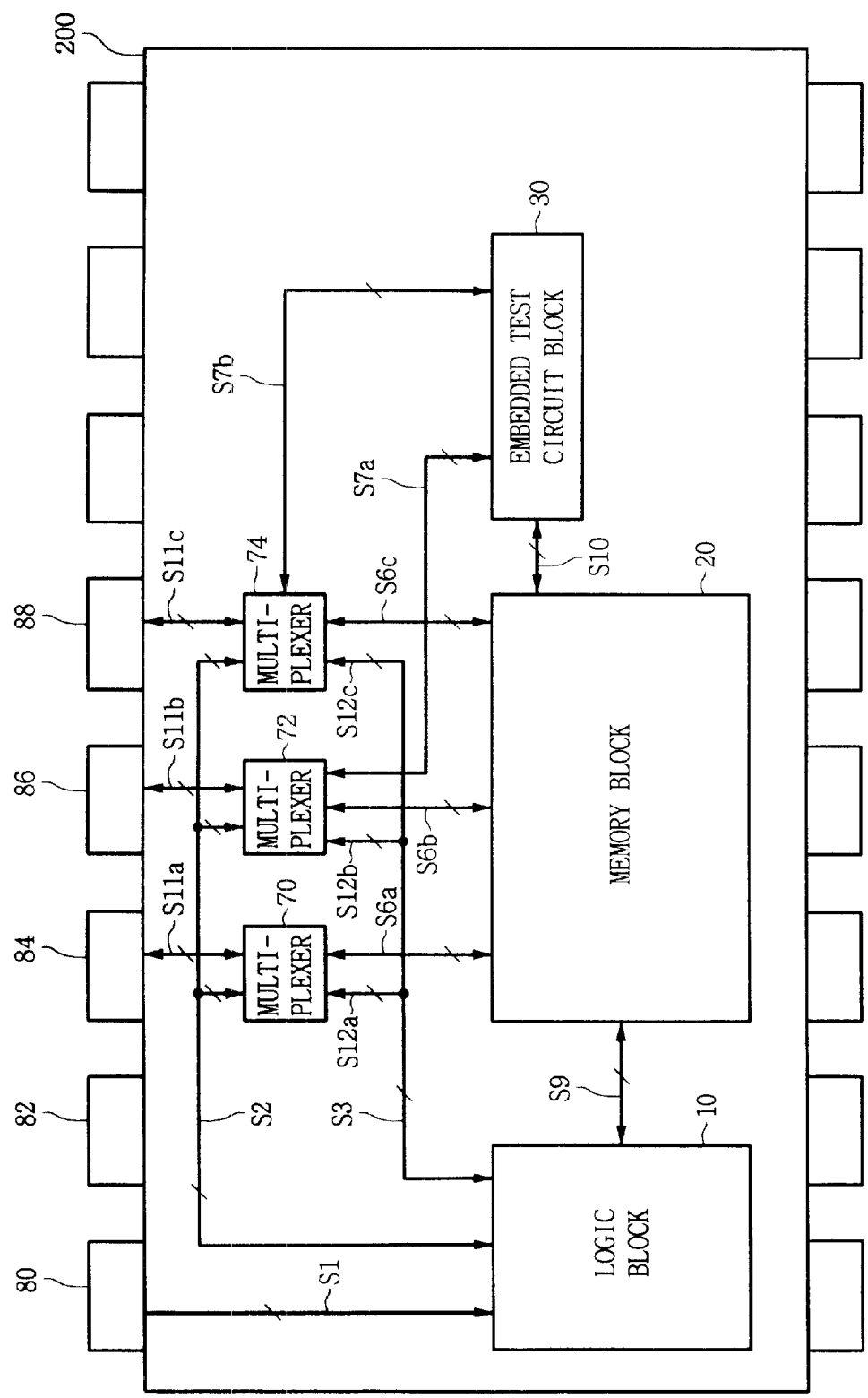
FIG. 2 is a block diagram of one embodiment of a semiconductor device with embedded memory cells in accordance with the present invention.

The present invention is described in detail with reference to the accompanying drawings. FIG. 2 is a block diagram for illustrating a semiconductor device with embedded memory cells in accordance with the present invention. The semiconductor device 200 comprises a logic block 10, a memory block 20, an embedded test circuit block 30, multiplexers 70, 72, 74 and pads 80, 82, 84, 86, 88. Identical reference numerals are used for the blocks with the same functions throughout the drawings.

Figure 1:
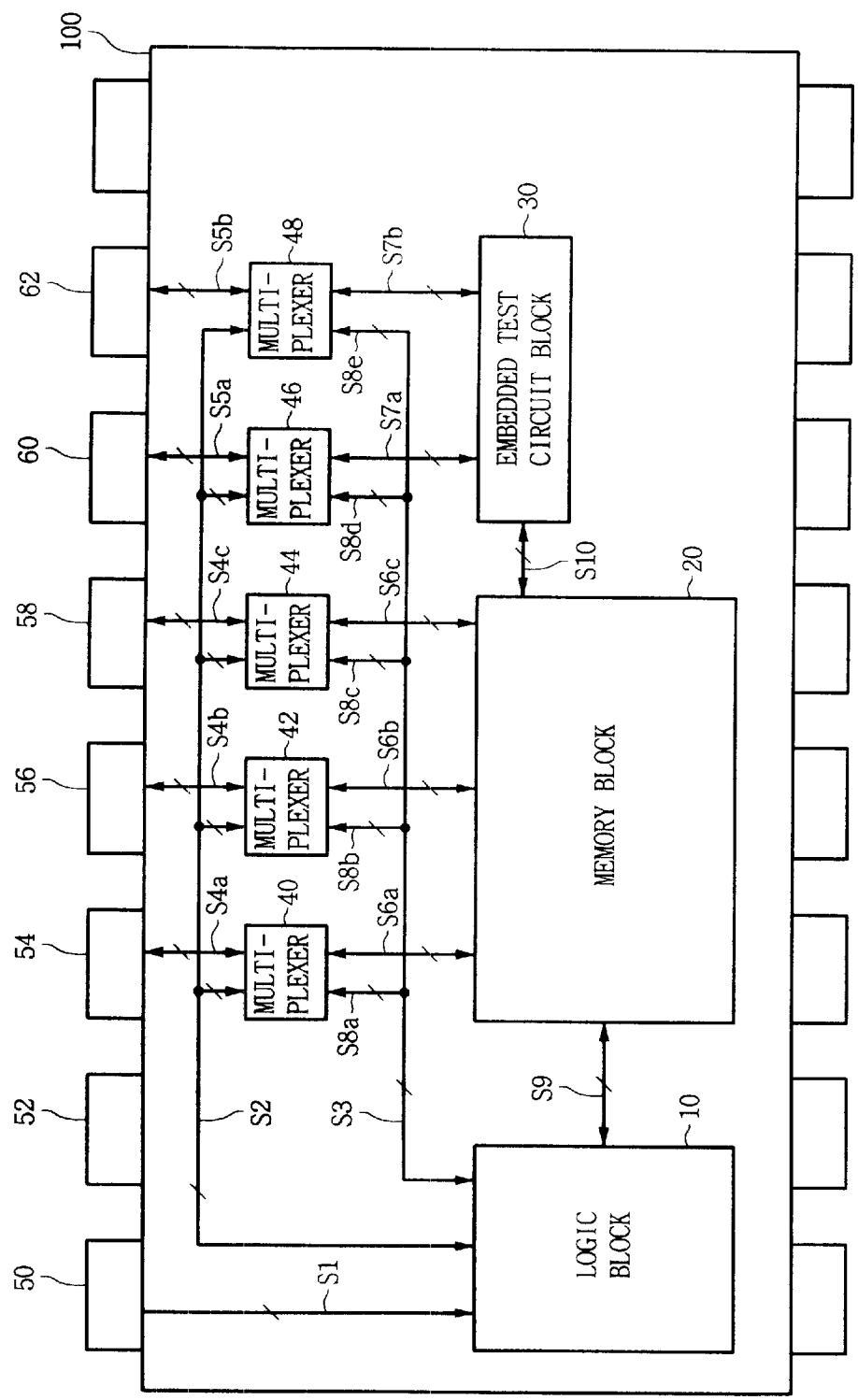
FIG. 1 is a block diagram of a conventional semiconductor device with embedded memory cells.

The functions of respective blocks thus constructed will be described below. The functions of the logic block 10, the memory block 20 and the embedded circuit block 30 are identical to those of the blocks shown in FIG. 1. The pad 80 is to be used only in the normal operation mode, but not in the test modes. The pad 82 is a control pad to transmit control signals for changing modes between normal operation, the direct access test and the built-in self test. The pad 84 inputs and outputs data with the logic block 10 in the normal operation mode, and transmits addresses to the memory block 20 in the direct access test mode. The pad 86 inputs and outputs data with the logic block 10 in the normal operation mode, transmits control signals to the memory block 20 in the direct access test mode, and transmits BIST control signals to the embedded test circuit block 30 in the built-in self test mode. The pad 88 inputs and outputs data with the logic block 10 in the normal operation mode, inputs and outputs data with the memory block 20 in the direct access test mode, and outputs a test result generated from the embedded test circuit block 30 in the built-in self test mode.

The multiplexer 70 responds to mode control signals to input and output data between the pad 84 and the logic block 10 in the normal operation mode, and to transmit addresses from the pad 84 to the memory block 20 in the direct access test mode. The multiplexer 72 responds to the mode control signals to input and output data between the pad 86 and the logic block 10 in the normal operation mode, to transmit control signals from the pad 86 to the memory block 20 in the direct access test mode, and to transmit BIST control signals from the pad 86 to the embedded test circuit block 30 in the built-in self test mode. The multiplexer 74 responds to mode control signals to input and output data between the pad 88 and the logic block 10 in the normal operation mode, to input and output data between the pad 88 and the memory block 20 in the direct access test mode, and to output a test result generated from the embedded test circuit block 30 to the pad 88 in the built-in self test mode. The multiplexer 70 is constructed in the structure of a general 2-1 multiplexer, which selects and outputs one control signal out of the signals input from two groups. The multiplexers 72, 74 are constructed in the structure of a general 3-1, which selects and outputs one control signal out of a plurality of signals input from three groups.

Reference signs shown in FIG. 2 will be described below. S symbolizes a respective signal in the drawing. S1, S2, S3, S6a, S6b, S6c, S7a, S7b, S9, and S10 are the same as those described in FIG. 1. S11a is an address signal or data signal to be transmitted from the pad 84 to the memory block 20. S11b is a control signal to be transmitted from the pad 86 to the memory block 20, a data signal to be transmitted from the pad 86 to the logic block 10 or a BIST control signal to be transmitted from the pad 86 to the embedded test circuit block 30. S11c is a data signal to be transmitted from the pad 88 to the logic block 10, a test data signal to be transmitted from the pad 88 to the memory block 20, or a test result signal to be transmitted from the embedded test circuit block 30 to the pad 88. These signals do not have one identical bit, but respectively a predetermined bit. Even if each of the pads 80, 82, 84, 86, 88 is respectively shown as one pad, it is not composed of a single pad but grouped by combining the predetermined number of pads with similar functions. The other pads without specific numerals belong to one of those represented in specific reference numerals.

As described above, the semiconductor device with embedded memory cells is constructed to share pads that are used for both the direct access test mode and the built-in self test mode, so that there is no need to change connections between the memory tester and the pads when a test is performed in any of those test modes.

Firstly, the direct access test of the semiconductor device with embedded memory cells will be described in accordance with the present invention with reference to FIG. 2. In the case of the direct access test mode, a control signal is sent from the memory tester (not shown) through the pad 82 to the multiplexers 70, 72, 74. The multiplexers 70, 72, 74 output addresses, control signals and data signals to the memory block 20. In the direct access test mode, signals are not input to the pad 80. Therefore, the memory tester writes data through the pad 88 to the memory block 20 and reads the written data to determine whether they are identical to the written data to test the operational states (normal or defective) of the memory block 20. The direct access test is performed in accordance with test procedures programmed in the memory tester.

Secondly, the built-in self test of the semiconductor device with embedded memory cells will be described in accordance with the present invention with reference to FIG. 2. In the case of the built-in self test, a control signal is sent from the memory tester (not shown) through the pad 82 to the multiplexers 70, 72, 74 to disable the multiplexer 70 and to enable the multiplexers 72, 74. When the memory tester transmits a control signal to drive the embedded test circuit block 30 through the pad 86, the multiplexer 72 transmits this signal to the embedded test circuit block 30. Then, the embedded test circuit block 30 transmits addresses, control signals and data signals to the memory block 20 to perform write and read operations. It determines whether the read data are identical to the written data and outputs the test result through the multiplexer 74 to the pad 88. The built-in self test is performed on the memory cells of the memory block 20 in accordance with the aforementioned procedures.

In other words, the semiconductor device with embedded memory cells shares the pads that are used to perform the direct access test and the built-in self test without changes in probing test modes between the memory tester and the semiconductor device, so that switching between the direct access test mode and the built-in self test mode can be performed easily.

Therefore, there is an advantage in the disclosed semiconductor device with embedded memory cells over the conventional device, in that the pads are shared to perform the direct access test and the built-in self test without changes in probing test modes between the memory tester and the semiconductor device, thereby easily switching between the direct access test mode and the built-in self test modes.

What is claimed is:

1. A semiconductor device with an embedded test circuit block having a memory block, a logic block for inputting and outputting data with the memory block and performing specific functions, and an embedded test circuit block for testing the memory block in accordance with the signals input from outside the device, the device comprising:

a first signal terminal group for inputting mode control signals for changing modes between a normal operation, a direct access test and a built-in self test;

a second signal terminal group for inputting and outputting data from outside the device to the logic block;

a third signal terminal group for transmitting addresses from outside the device to the memory block in the direct access test mode and for inputting and outputting data with the logic block in the normal operation mode;

a fourth signal terminal group for transmitting the mode control signals outputted from the first signal terminal group to the memory block in the direct access test mode, for inputting and outputting data with the logic block in the normal operation mode and for transmitting mode control signals to the embedded circuit block in the built-in self test mode;

a fifth signal terminal group for inputting test data from outside the device to the memory block and outputting the data from the memory block in the direct access test mode, for inputting and outputting data with the logic block in the normal operation mode, and for outputting a test result generated from the embedded test circuit block to outside the device in the self test mode;

first selection means for transmitting data between the third signal terminal group and the logic block in the normal operation mode in response to mode control signals, and for transmitting addresses from the third signal terminal group to the memory block in the direct access test mode;

second selection means for transmitting data between the fourth signal terminal group and the logic block in the normal operation mode in response to the mode control signals, for transmitting the memory block control signals from the fourth signal terminal group to the memory block in the direct access test mode, and for transmitting the self test control signals from the fourth signal terminal group to the embedded test circuit block in the built-in self test mode; and third selection means for transmitting data between the fifth signal terminal group and the logic block in the normal operation mode in response to the mode control signals, for inputting and outputting data between the fifth signal terminal group and the memory block in the direct access test mode, and for outputting the test result from the embedded test circuit block through the fifth signal terminal group in the built-in self test mode.

2. The device as defined in claim 1, wherein each of the signal terminal groups comprises a predetermined number of pads.

3. The device as defined in claim 1, wherein each of the signal terminal groups comprises a predetermined number of pins.

4. A semiconductor device with embedded memory cells having at least three modes, a normal operation, a direct access test and a built-in self test, the device comprising:

a logic block for inputting and outputting data from a memory block;

a memory block for writing and reading data in response to addresses or control signals;

an embedded test circuit block for performing read/write tests on the memory block;

at least three multiplexers;

a control pad to transmit mode control signals to at least one multiplexer for changing modes between the normal operation, direct access test and built-in self test;

a first pad for inputting and outputting data with the logic block in the normal operation mode, and transmitting addresses to the memory block in the direct access test mode;

a second pad for inputting and outputting data with the logic block in the normal operation mode, transmitting control signals to the memory block in the direct access test mode, and transmitting BIST control signals to the embedded test circuit block in the built-in self test mode;

a third pad for inputting and outputting data with the logic block in the normal operation mode, inputting and outputting data with the memory block in the direct access test mode, and outputting a test result generated from the embedded test circuit block in the built-in self test mode.

5. A semiconductor device as claimed in claim 4, comprising:

a first multiplexer which responds to mode control signals to input and output data between the first pad and the logic block in the normal operation mode, and to transmit addresses from the first pad to the memory block in the direct access test mode;

a second multiplexer which responds to the mode control signals to input and output data between the second pad and the logic block in the normal operation mode, to transmit control signals from the second pad to the memory block in the direct access test mode, and to transmit BIST control signals from the second pad to the embedded test circuit block in the built-in self test mode; and a third multiplexer which responds to the mode control signals to input and output data between the third pad and the logic block in the normal operation mode, to input and output data between the third pad and the memory block in the direct access test mode, and to output a test result generated from the embedded test circuit block to the third pad in the built-in self test mode.

6. A semiconductor device as claimed in claim 5, wherein the first multiplexer is constructed in the structure of a general 2-1 multiplexer, and the second a third multiplexers are constructed in the structure of a general 3-1 multiplexer.

7. A semiconductor device with embedded memory cells having three modes of operation: a normal operation, a direct access test and a built-in self test; the device comprising:

a logic block;

a memory block;

an embedded test circuit block;

first means for transmitting control signals for changing modes between the normal operation, direct access test and built-in self test;

second means for inputting and outputting data with the logic block in the normal operation mode, and transmitting addresses to the memory block in the direct access test mode;

third means for inputting and outputting data with the logic block in the normal operation mode, transmitting control signals to the memory block in the direct access test mode, and transmitting BIST control signals to the embedded test circuit block in the built-in self test mode;

fourth means for inputting and outputting data with the logic block in the normal operation mode, inputting and outputting data with the memory block in the direct access test mode, and outputting a test result generated from the embedded test circuit block in the built-in self test mode;

fifth means for responding to mode control signals and to input and output data between the second means and the logic block in the normal operation mode, and to transmit addresses from the second means to the memory block in the direct access test mode;

sixth means for responding to the mode control signals and to input and output data between the third means and the logic block in the normal operation mode, to transmit control signals from the third means to the memory block in the direct access test mode, and to transmit BIST control signals from the third means to the embedded test circuit block in the built-in self test mode; and seventh means for responding to the mode control signals and to input and output data between the fourth means and the logic block in the normal operation mode, to input and output data between the fourth means and the memory block in the direct access test mode, and to output a test result generated from the embedded test circuit block to the fourth means in the built-in self test mode.

8. A semiconductor device as claimed in claim 7, wherein the device comprises a first multiplexer, which is constructed in the structure of a general 2-1 multiplexer, and a second and third multiplexer, which are constructed in the structure of a general 3-1 multiplexer.

* * * * *